(12) United States Patent
Neti et al.

(10) Patent No.: US 10,161,988 B2
(45) Date of Patent: Dec. 25, 2018

(54) METHODS AND SYSTEMS FOR MONITORING A FLUID LIFTING DEVICE

(71) Applicant: General Electric Company, Schenectady, NY (US)

(72) Inventors: Prabhakar Neti, Nikayuna, NY (US); Yingneng Zhou, Shanghai (CN); Liwei Hao, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 15/309,529

(22) PCT Filed: May 14, 2015

(86) PCT No.: PCT/US2015/030688
§ 371 (c)(1),
(2) Date: Nov. 8, 2016

(87) PCT Pub. No.: WO2015/175737
PCT Pub. Date: Nov. 19, 2015

(65) Prior Publication Data
US 2017/0184657 A1      Jun. 29, 2017

Related U.S. Application Data

(60) Provisional application No. 61/994,214, filed on May 16, 2014.

(51) Int. Cl.
*G01R 31/02* (2006.01)
*G01R 31/12* (2006.01)
(Continued)

(52) U.S. Cl.
CPC ........ *G01R 31/1272* (2013.01); *E21B 17/003* (2013.01); *E21B 41/0092* (2013.01);
(Continued)

(58) Field of Classification Search
CPC .. E21B 41/0092; E21B 43/128; E21B 43/164; E21B 43/24; E21B 17/003;
(Continued)

(56) References Cited

U.S. PATENT DOCUMENTS 6,260,004 B1   7/2001   Hays et al.
6,709,240 B1   3/2004   Schmalz et al.
(Continued)

FOREIGN PATENT DOCUMENTS

CN   102628915 A   8/2012
WO   0186831 A1   11/2001
WO   2004028064 A2   4/2004

OTHER PUBLICATIONS

Bates et al., "Taking the Pulse of Producing Wells: ESP Surveillance", Oilfield Review, vol. 16, Issue 2, pp. 16-25, Jun. 2004.
(Continued)

*Primary Examiner* — Thang Le
(74) *Attorney, Agent, or Firm* — GE Global Patent Operation (57) ABSTRACT

A system (100, 200) is presented. The system includes a fluid lifting device (102, 202) located inside a well (106, 206), and comprising an electrical motor (108, 208), a three phase cable (114, 214) for coupling the fluid lifting device to a power source (112, 212), at least one high sensitivity differential current transformer (104, 203, 204) for generating imbalance signals (128, 227) representative of an imbalance current in at least one of the electrical motor and the three phase cable, wherein the at least one high sensitivity differential current transformer is disposed such that the at least one high sensitivity differential current transformer surrounds at least a portion of the three phase cable, and a processing subsystem (136, 236) for monitoring the health
(Continued)

of at least one of the fluid lifting device and the three phase cable based on the imbalance signals.

19 Claims, 5 Drawing Sheets

(51) Int. Cl.
| | |
|---|---|
| *E21B 43/12* | (2006.01) |
| *E21B 47/00* | (2012.01) |
| *E21B 17/00* | (2006.01) |
| *E21B 41/00* | (2006.01) |
| *H01B 9/02* | (2006.01) |
| *H02G 9/02* | (2006.01) |
| *E21B 47/12* | (2012.01) |
| *F04D 13/06* | (2006.01) |
| *F04D 13/08* | (2006.01) |

(52) U.S. Cl.
CPC ........ *E21B 43/128* (2013.01); *E21B 47/0007* (2013.01); *G01R 31/021* (2013.01); *H01B 9/02* (2013.01); *H02G 9/02* (2013.01); *E21B 47/12* (2013.01); *F04D 13/0693* (2013.01); *F04D 13/086* (2013.01)

(58) Field of Classification Search
CPC .... E21B 47/0007; E21B 47/12; E21B 47/121; E21B 47/102; E21B 47/101; F04D 13/086; F04D 13/0693; H02H 3/347; H02H 3/105; G01R 31/1272; G01R 31/021; G01R 31/022; G01R 31/024; G01R 31/025; G01R 31/026; G01R 31/041; G01R 31/08; G01R 31/088; G01R 31/11; G01R 31/1263; G01V 3/20; G01V 3/22; G01V 3/24; G01V 3/082; G01V 3/083; G01V 3/12; G01V 3/02; G01V 3/265; G01V 11/005; G01N 27/205
USPC ....... 324/347, 348, 351, 539, 541, 543–544, 324/558
See application file for complete search history.

(56) References Cited

U.S. PATENT DOCUMENTS

| | | | |
|---|---|---|---|
| 6,933,693 | B2 | 8/2005 | Schuchmann |
| 7,028,543 | B2 | 4/2006 | Hardage et al. |
| 7,168,924 | B2* | 1/2007 | Beck ..................... E21B 43/126 417/1 |
| 7,330,779 | B2* | 2/2008 | Schulz ................ E21B 41/0021 417/44.11 |
| 7,936,543 | B2* | 5/2011 | Restrepo ................ H02H 3/335 324/110 |
| 7,979,240 | B2 | 7/2011 | Fielder |
| 9,828,850 | B2* | 11/2017 | Boyanapally ......... E21B 17/028 |
| 9,970,273 | B2* | 5/2018 | Gupta ................... E21B 43/128 |
| 2005/0083617 | A1* | 4/2005 | Blumenauer ........ H02H 1/0038 361/42 |
| 2007/0175633 | A1 | 8/2007 | Kosmala et al. |
| 2009/0055029 | A1 | 2/2009 | Roberson et al. |
| 2009/0101338 | A1* | 4/2009 | Flanders ............... E21B 43/128 166/250.01 |
| 2010/0194585 | A1* | 8/2010 | Skinner ................ E21B 43/128 340/853.2 |
| 2011/0006802 | A1 | 1/2011 | Younsi et al. |
| 2012/0027630 | A1 | 2/2012 | Forsberg et al. |

OTHER PUBLICATIONS

Harihara et al. "Fault Diagnosis of Centrifugal Pumps Using Motor Electrical Signals", Centrifugal Pumps, Dr. Dimitris Papantonis (Ed), InTech, 2012.

IPRP Search Report and Written Opinion issued in connection with corresponding PCT Application No. PCT/US2015/030688 dated Nov. 15, 2016.

U.S. Appl. No. 61/992,939, filed May 14, 2014.

PCT Search Report and Written Opinion issued in connection with corresponding PCT Application No. PCT/US2015/030688 dated Oct. 20, 2015.

* cited by examiner

METHODS AND SYSTEMS FOR MONITORING A FLUID LIFTING DEVICE

CROSS REFERENCE TO RELATED APPLICATIONS

This non-provisional application is a national stage application under application under 35 U.S.C. § 371(c) of prior filed PCT application serial number PCT/US2015/030688, filed on May 14, 2015, which claims the benefit of priority under 35 U.S.C. § 119(e) to U.S. Provisional Patent Application Ser. No. 61/994,214 filed May 16, 2014 and U.S. Provisional Patent Application Ser. No. 61/992,939 filed May 14, 2014. The above-listed applications are incorporated herein by reference in their entirety.

BACKGROUND

The subject matter disclosed herein relates to fluid lifting devices and more particularly to monitoring health of the fluid lifting devices.

Generally, production of fluids from wells, such as oil wells, entails use of a variety of fluid lifting devices located downhole in the wells to pump the fluids from the wells to collection equipment. The collection equipment is typically located outside the well. Furthermore, the fluids are then transported from the collection equipment to processing stations. These fluid lifting devices, for example, may include electric submersible pumps (ESP) and subsea boosting systems (SBS). The ESP and SBS are typically located inside a well and hence are operated in extremely harsh environments, such as high temperature and high pressure environments. One or more sensors (hereinafter referred to as 'downhole sensors') located inside the well may monitor various parameters of the ESP and/or SBS. For example, the monitored parameters may include temperature, pressure, flow, vibrations inside the well, and the like. Typically, the downhole sensors are operationally coupled to remote monitoring systems that are located outside the wells and detect one or more faults in the ESP and/or SBS. The harsh operating environment of the downhole sensors entails use of robust downhole sensors which in turn leads to higher cost of the downhole sensors in comparison to sensors for monitoring motors located outside the wells.

Furthermore, such downhole sensors are generally limited by respective capabilities at least due to corresponding operational locations. Hence signals received from the downhole sensors may not be sufficient for predicting and detecting one or more defects in the ESP/SBS or cables that connect the ESP and/or the SBS to the remote monitoring systems. Consequently current remote monitoring systems lack the ability to proactively predict one or more potential defects in the ESP and/or SBS, and fail to provide advanced failure warnings. The lack of failure warnings may result in unexpected and prolonged oil-production-down-time with several other complications, such as maintenance scheduling challenges and loss of production.

BRIEF DESCRIPTION

In accordance with one embodiment, a system is presented. The system includes a fluid lifting device located inside a well, and comprising an electrical motor, a three phase cable for coupling the fluid lifting device to a power source, at least one high sensitivity differential current transformer for generating imbalance signals representative of an imbalance current in at least one of the electrical motor and the three phase cable, wherein the at least one high sensitivity differential current transformer is disposed such that the at least one high sensitivity differential current transformer surrounds at least a portion of the three phase cable, and a processing subsystem for monitoring the health of at least one of the fluid lifting device and the three phase cable based on the imbalance signals.

In accordance with another embodiment, a system is presented. The system includes a fluid lifting device located inside a well, the fluid lifting device comprising an electrical motor, a three phase cable for coupling the fluid lifting device to a power source, a first high sensitivity differential current transformer for generating first imbalance signals representative of an imbalance current in the electrical motor, wherein the first high sensitivity differential current transformer is disposed such that the first high sensitivity differential current transformer surrounds a first portion of the three phase cable, wherein the first high sensitivity differential current transformer is disposed inside the well, and a second high sensitivity differential current transformer for generating second imbalance signals representative of a total imbalance current in the electrical motor and the three phase cable, wherein the second high sensitivity differential current transformer is disposed such that the second high sensitivity differential current transformer surrounds a second portion of the three phase cable, wherein the second high sensitivity differential current transformer is disposed outside the well, and a processing subsystem that monitors the health of the three phase cable based on the imbalance current in the electrical motor and the total imbalance current in the electrical motor and the three phase cable.

In accordance with still another embodiment, a method for monitoring health of a three phase cable that couples a fluid lifting device to a power source is presented. The method includes the steps of determining an imbalance current in an electrical motor disposed in the fluid lifting device based on first imbalance signals, determining a total imbalance current in the electrical motor and the three phase cable based on second imbalance signals, determining an imbalance current in the three phase cable based on the imbalance current in an electrical motor and the total imbalance current in the electrical motor and the three phase cable, and determining whether an insulation defect exists in the three phase cable based on the imbalance current in the three phase cable and a cable-insulation-defect threshold.

DRAWINGS

These and other features and aspects of embodiments of the present disclosure will become better understood when the following detailed description is read with reference to the accompanying drawings in which like characters represent like parts throughout the drawings, wherein.

DETAILED DESCRIPTION

Unless defined otherwise, technical and scientific terms used herein have the same meaning as is commonly understood by one of ordinary skill in the art to which this disclosure belongs. The terms "a" and "an" do not denote a limitation of quantity, but rather denote the presence of at least one of the referenced items. The term "or" is meant to be inclusive and mean one, some, or all of the listed items. The use of "including," "comprising" or "having" and variations thereof herein are meant to encompass the items listed thereafter and equivalents thereof as well as additional items. The terms "control system" or "controller" may include either a single component or a plurality of components, which are either active and/or passive and are connected or otherwise coupled together to provide the described function or functions. The terms "processing subsystem", "control system" or "controller" may include either a single component or a plurality of components, which are either active and/or passive and are connected or otherwise coupled together to provide the described function or functions. The term "processing subsystem" may include a digital signal processor, a microprocessor, a microcomputer, a microcontroller, and/or any other suitable device.

Figure 1:
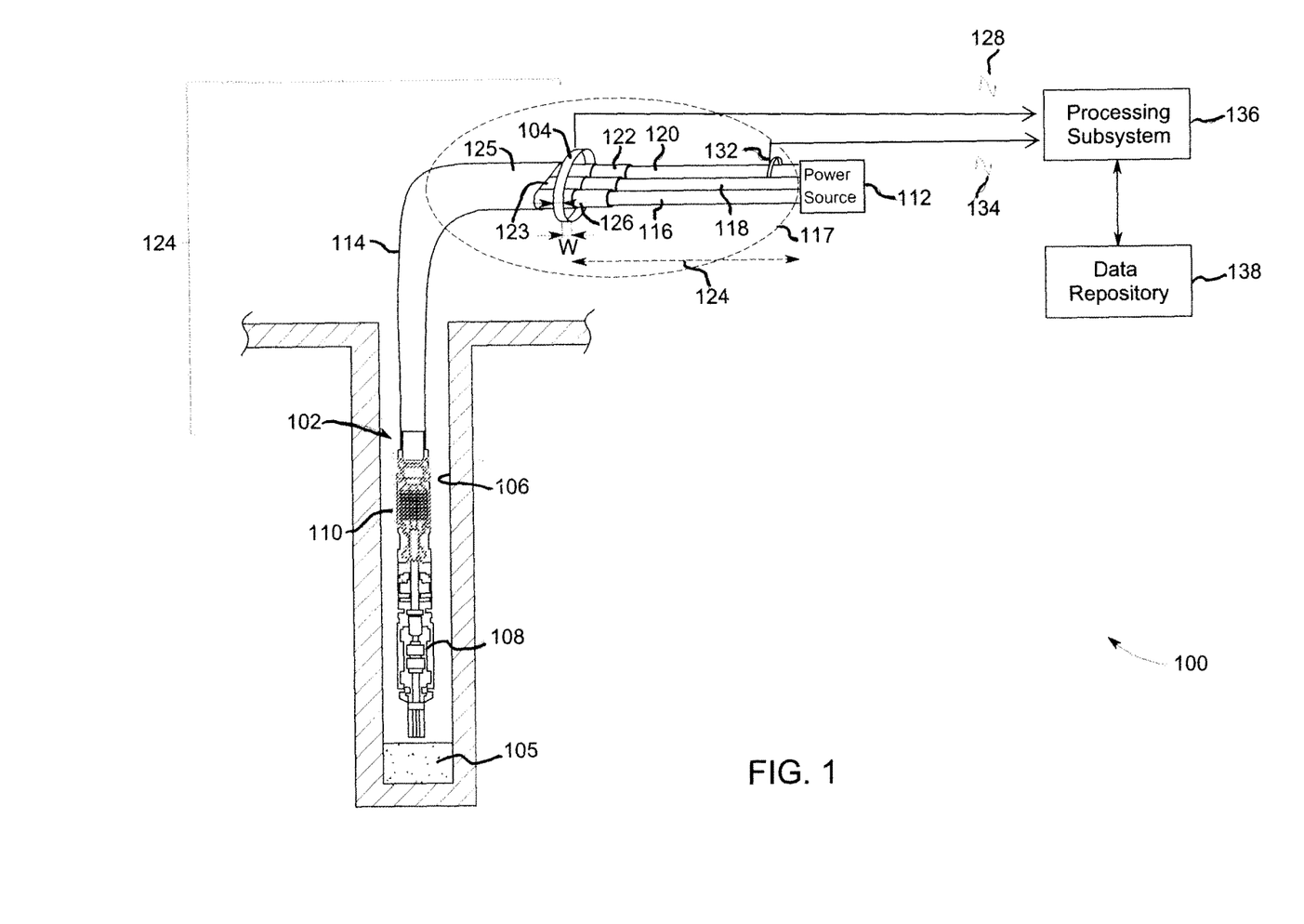
FIG. 1 is a diagrammatic illustration of a system for monitoring health of at least one of a fluid lifting device and a three phase cable using a high sensitivity differential current transformer (HSCT), in accordance with aspects of the present specification.

FIG. 1 is a diagrammatic illustration of a system 100 for monitoring health of at least one of an artificial fluid lifting device 102 and a three phase cable 114 using a high sensitivity differential current transformer (HSCT) 104, in accordance with certain aspects of the present specification. The terms "artificial fluid lifting device" and "fluid lifting device" may be used interchangeably. The system 100 includes the fluid lifting device 102 that is disposed inside a well 106. The fluid lifting device 102 may be configured to draw a fluid 105 outside the well 106. The well 106, for example, may be an oil well. The fluid lifting device 102, for example, may be an electrical submersible pump (ESP), a subsea boosting system (SBS), and the like. In a presently contemplated configuration, the fluid lifting device 102 is an electrical submersible pump.

The fluid lifting device 102, for example, may include an electrical motor 108 and a pump 110. The fluid lifting device 102 may also include other components (not shown), such as but not limited to a down-hole sensor, and a seal. Also, the fluid lifting device 102 is coupled to a power source 112 via the three phase cable 114. The power source 112 supplies electric energy to the fluid lifting device 102 for operating the fluid lifting device 102.

In one embodiment, the three phase cable 114, for example, includes a first phase conductor 116, a second phase conductor 118, and a third phase conductor 120. Moreover, each of the three conductors 116, 118, 120 and the three phase cable 114 may be covered by one or more cable sheaths. Reference numeral 117 is representative of an exposed view of a portion of the three phase cable 114. For example, in the presently contemplated configuration, each of the conductors 116, 118, 120 is covered by a respective first cable sheath 122 and a respective second cable sheath 123. The one or more cable sheaths 122, 123 are configured to insulate the conductors 116, 118, 120 from each other and external environment. Additionally, the three phase cable 114 is covered by a grounding cable sheath 125. The grounding cable sheath 125 may be configured to ground the three phase cable 114. For example, the grounding cable sheath 125 may be a metallic sheath, a metallic screen, an armor, or windings of metallic wires surrounding the three phase cable 114. It may be noted that for ease of illustration, portions of the three phase cable 114 are shown as uncovered.

The three conductors 116, 118, 120 carry three alternating currents of substantially similar frequency that reach respective instantaneous peak values at different instants of time. For example, the first phase conductor 116 may carry an alternating current $I_1$, the second phase conductor 118 may carry an alternating current $I_2$, and the third phase conductor 120 may carry an alternating current $I_3$. In an ideal situation, a sum of the three alternating currents $I_1$, $I_2$, $I_3$ should be zero as shown by equation (1):

$$I_1+I_2+I_3=0 \qquad (1)$$

Presence of one or more defects in the fluid lifting device 102 and/or the three phase cable 114 may result in imbalance currents in the three phase cable 114 and/or the electrical motor 108. In one example, when the electrical motor 108 and the three phase cable 114 have imbalance currents, then the total of the three alternating currents $I_1$, $I_2$, $I_3$ is equal to a total of the imbalance currents (hereinafter referred to as "a total imbalance current") in the electrical motor 108 and the three phase cable 114. By way of example, if an imbalance current in the electrical motor 108 is represented by $I_4$ and an imbalance current in the three phase cable 114 is represented by $I_5$, then the total of the three alternating currents $I_1$, $I_2$, $I_3$ is equal to a total of the imbalance currents $I_4$ and $I_5$ as shown in equation (2):

$$I_1+I_2+I_3=I_4+I_5 \qquad (2)$$

wherein $I_4+I_5$ represents the total imbalance current in the electrical motor 108 and the three phase cable 114.

The system 100 further includes at least one HSCT 104 that surrounds a portion of the three phase cable 114. While the presently contemplated configuration depicts use of a single HSCT 104, in other embodiments the system 100 may include more than one HSCT. In the presently contemplated configuration, the HSCT 104 is located outside the well 106. In other embodiments, the HSCT 104 may be located inside the well 106. An example of the HSCT 104 is described with reference to FIG. 5.

In one embodiment, a first section 124 of the three phase cable 114 is covered by one or more of the cable sheaths 122, 123 and the grounding cable sheath 125. In addition, a second section 126 of the three phase cable 114 is covered by the cable sheaths 122, 123 but is not covered by the grounding cable sheath 125. For ease of illustration, a portion of the first section 124 is shown as not being covered by one or more of the cable sheaths 122, 123 and the grounding cable sheath 125. In one embodiment, the HSCT 104 is mounted around the second section 126 of the three phase cable 114 that is covered only by the first cable sheath 122 and the second cable sheath 123. In one embodiment, a length of the second section 126 is substantially equal to a width W of the HSCT 104.

Figure 2:
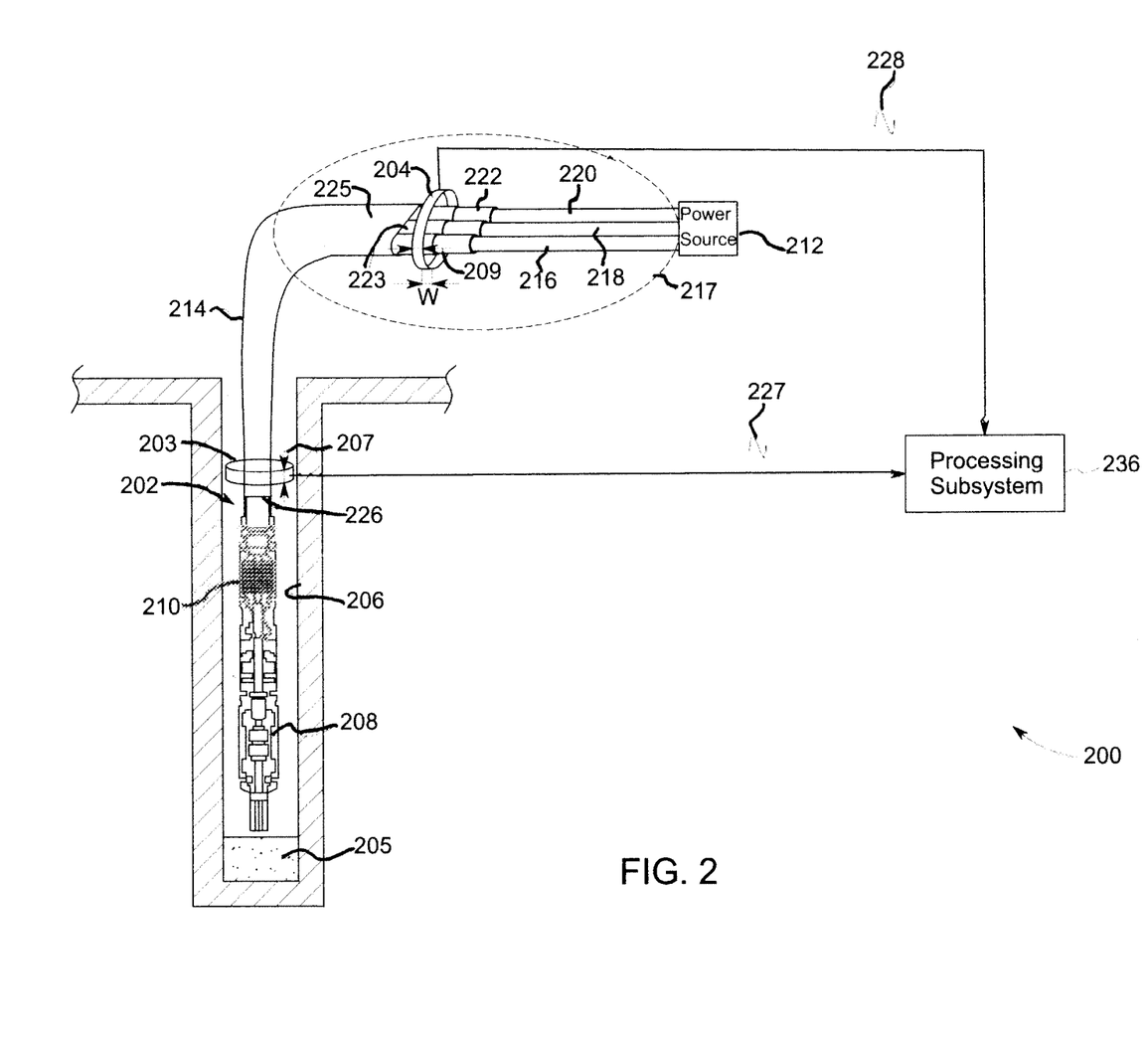
FIG. 2 is a diagrammatic illustration of a system for monitoring health of a three phase cable using a first HSCT and a second HSCT, in accordance with aspects of the present specification.

During operation of the fluid lifting device 102, the HSCT 104 is configured to measure imbalance currents and generate imbalance signals 128. The HSCT 104 is configured to measure very small imbalance currents (in the order of milli amperes) present in an overwhelming background of large currents (in the order of kilo amperes) of the electrical motor 108. In one embodiment, when the HSCT 104 is located outside the well 106, the HSCT 104 is configured to generate the imbalance signals 128 representative of the total imbalance current in the electrical motor 108 and the three phase cable 114. In another embodiment, when the HSCT 104 is located inside the well 106 at a junction (as depicted in FIG. 2) where the three phase cable 114 is coupled to the fluid lifting device 102, then the HSCT 104 is configured to generate imbalance signals representative of the imbalance current $I_4$ in the electrical motor 108. Although the embodiment of FIG. 1 shows use of one HSCT 104, in other embodiments the system 100 may include more than one HSCT. By way of an example, a first HSCT may be located inside the well 106 at the junction where the three phase cable 114 is coupled to the fluid lifting device 102 and a second HSCT may be located outside the well 106. An example of a system wherein the first HSCT is located inside a well and the second HSCT is located outside the well will be described with reference to FIG. 2.

The system 100 further includes at least one on-surface sensing-device 132 that is coupled to at least one of the first phase conductor 116, the second phase conductor 118, and the third phase conductor 120. For example, as shown in the presently contemplated configuration, the on-surface sensing device 132 is coupled to the third phase conductor 120. The on-surface sensing device 132, for example, may be a transformer, a current sensor, a voltage sensor, a high frequency current transformer, a radio frequency current transformer, and the like. In the embodiment of FIG. 1, the on-surface sensing device 132 is located outside the well 106. Hence the on-surface sensing device 132 is not exposed to the harsh environment inside the well 106. In the present example, since the on-surface sensing device 132 is coupled to the third phase conductor 120, the on-surface sensing device 132 generates electrical signals 134 representative of a current and voltage of the third phase conductor 120.

Furthermore, the system 100 includes a processing subsystem 136 operationally coupled to the HSCT 104 and the on-surface sensing device 132. The processing subsystem 136 receives the imbalance signals 128 from the HSCT 104. Additionally, the processing subsystem 136 receives the electrical signals 134 from the on-surface sensing device 132. In one embodiment, when the imbalance signals 128 are representative of the total imbalance current ($I_4$ and $I_5$) in the electrical motor 108 and the three phase cable 114, then the processing subsystem 136 processes the imbalance signals 128 to determine the total imbalance current in the electrical motor 108 and the three phase cable 114. Additionally, the processing subsystem 136 may be configured to monitor the health of the fluid lifting device 102 and/or the three phase cable 114 based on the imbalance signals 128. In particular, the processing subsystem 136, for example, monitors the health of the fluid lifting device 102 and/or the three phase cable 114 based on the total imbalance current in the electrical motor 108 and the three phase cable 114. Moreover, specifically the processing subsystem 136 may be configured to detect presence of insulation defects in the electrical motor 108 and/or the three phase cable 114 based on the total imbalance current. The monitoring of the health of the fluid lifting device 102 and/or the three phase cable 114 will be described in greater detail with reference to FIG. 3 and FIG. 4. If the presence of one or more insulation defects in the electrical motor 108 and/or the three phase cable 114 is detected, an operator or a user may be notified. The operator and/or the user may repair the identified defects.

As noted hereinbefore, the processing subsystem 136 receives the electrical signals 134 from the on-surface sensing device 132. The processing subsystem 136 is further configured to process the electrical signals 134 to determine presence of one or more defects in one or more components of the electrical motor 108 and/or the pump 106 based on the electrical signals 134. The one or more components, for example, may include a rotor, a stator, bearings, and sleeve bearings in the electrical motor 108. Furthermore, the one or more defects include high frequency electric discharge through the bearings, damaged bars of the rotor, insulation defects in the stator, and eccentricity faults in the electrical motor 108.

The processing subsystem 136 is coupled to a data repository 138. The data repository 138 may store the imbalance signals 128, the electrical signals 134, and any transitional data. The data repository 138, for example, may be data repository circuitry, local or remote hard disks, optical disks (CDs or DVDs), or other media, which may be accessed by the processing subsystem 136.

The present systems and methods monitor the health of the fluid lifting device 102 and/or the three phase cable 114 without interfering with or interrupting the operation of the fluid lifting device 102. In particular, the present systems and methods monitor the health of the fluid lifting device 102 and the three phase cable 114 while circumventing the need for taking the fluid lifting device 102 and the three phase cable 114 outside the well 106 to repair the fluid lifting device 102.

Furthermore, the foregoing examples, demonstrations, and process steps such as those that may be performed by the processing subsystem 136 may be implemented by suitable code on a processor-based system, such as a general-purpose or special-purpose computer. It should also be noted that different implementations of the present method may perform some or all of the steps described herein in different orders or substantially concurrently, that is, in parallel. Moreover, the functions may be implemented in a variety of programming languages, including but not limited to Python, C++ or Java. Such code may be stored or adapted for storage on one or more tangible, machine readable media, such as on data repository chipsets, local or remote hard disks, optical disks (that is, CDs or DVDs), or other media, which may be accessed by a processor-based system to execute the stored code.

FIG. 2 is a diagrammatic illustration of a system 200 for monitoring health of a three phase cable 214 using a first high sensitivity differential current transformer (HSCT) 203 and a second high sensitivity differential current transformer (HSCT) 204, in accordance with certain aspects of the present specification. The system 200 includes a fluid lifting device 202 disposed inside a well 206. The fluid lifting device 202 is configured to draw a fluid 205 outside a well 206. Also, the fluid lifting device 202 is coupled to a power source 212 via the three phase cable 214. The fluid lifting device 202, for example, may include an electrical motor 208 and a pump 210. The power source 212 supplies electric energy to the fluid lifting device 202 for operating the fluid lifting device 202.

Reference numeral 217 is representative of an exposed portion of the cable 214. The three phase cable 214, for example, includes a first phase conductor 216, a second phase conductor 218 and a third phase conductor 220. The three conductors 216, 218, 220 and the three phase cable 214 may be covered by one or more cable sheaths. For example, in a presently contemplated configuration, each of the conductors 216, 218, 220 is covered by a respective first cable sheath 222 and a respective second cable sheath 223. Additionally, the three phase cable 214 is covered by a grounding cable sheath 225 configured to ground the three phase cable 214. The three phase cable 214 is similar to the three phase cable 114 of FIG. 1. Furthermore, the three conductors 216, 218, 220 are similar to the three conductors 116, 118, 120 of FIG. 1.

Furthermore, the first HSCT 203 is disposed such that the first HSCT 203 surrounds a first portion 207 of the three phase cable 214. It may be noted that while the first portion 207 of the three phase cable 214 is covered by the first cable sheath 222 and the second cable sheath 223, the first portion 207 of the three phase cable 214 is not covered by the grounding cable sheath 225. Accordingly, the first HSCT 203 is mounted around the first portion 207 of the three phase cable 214 that is covered only by the first cable sheath 222 and the second cable sheath 223. In one embodiment, a length of the first portion 207 of the cable 214 is equal to a width of the first HSCT 203. As shown in FIG. 2, the first HSCT 203 is located inside the well 206. More particularly, in the presently contemplated configuration, the first HSCT 203 is located at a junction 226 where the three phase cable 214 is coupled to the fluid lifting device 202. The first HSCT 203 is configured to generate first imbalance signals 227 representative of an imbalance current $I_4$ in the electrical motor 208.

Additionally the second HSCT 204 is disposed such that the second HSCT 204 surrounds a second portion 209 of the three phase cable 214. It may be noted that while the second portion 209 of the three phase cable 214 is covered by the first cable sheath 222 and the second cable sheath 223, the second portion 209 of the three phase cable 214 is not covered by the grounding cable sheath 225. In one embodiment, a length of the second portion 209, for example is equal to a width of the second HSCT 204. In one example of FIG. 2, the second HSCT 204 is located outside the well 206. The second HSCT 204 is configured to generate second imbalance signals 228 representative of a total imbalance current ($I_4$ and $I_5$) in the three phase cable 214 and the electrical motor 208.

The system 200 further includes a processing subsystem 236 operationally coupled to the first HSCT 203 and the second HSCT 204. The processing subsystem 236, for example is similar to the processing subsystem 136 of FIG. 1. The processing subsystem 236 receives the first imbalance signals 227 from the first HSCT 203 and the second imbalance signals 228 from the second HSCT 204. The processing subsystem 236 is configured to monitor the health of the three phase cable 214 based on the first imbalance signals 227 and the second imbalance signals 228. Also, the processing subsystem 236 processes the first imbalance signals 227 to determine the imbalance current $I_4$ in the electrical motor 208. Furthermore, the processing subsystem 236 processes the second imbalance signals 228 to determine the total imbalance current ($I_4$ and $I_5$) in the electrical motor 108 and the three phase cable 214. Moreover, the processing subsystem 236 determines the imbalance current $I_5$ in the three phase cable 214 based on the total imbalance current ($I_4$ and $I_5$) in the electrical motor 208 and the three phase cable 214 and the imbalance current $I_4$ in the electrical motor 208. For example, the processing subsystem 236 determines the imbalance current $I_5$ in the three phase cable 214 using equation (3):

$$I_5 = T_{(I_4+I_5)} - I_4 \quad (3)$$

wherein $T_{(I_4+I_5)}$ is a total imbalance current in the electrical motor 208 and the three phase cable 214.

The processing subsystem 236 may also be configured to determine insulation defects in the three phase cable 214 based on the imbalance current $I_5$ in the three phase cable 214. If the presence of one or more insulation defects in the electrical motor 208 and/or the three phase cable 214 is detected, an operator or a user may be notified. The operator and/or the user may repair the identified defects.

Figure 3:
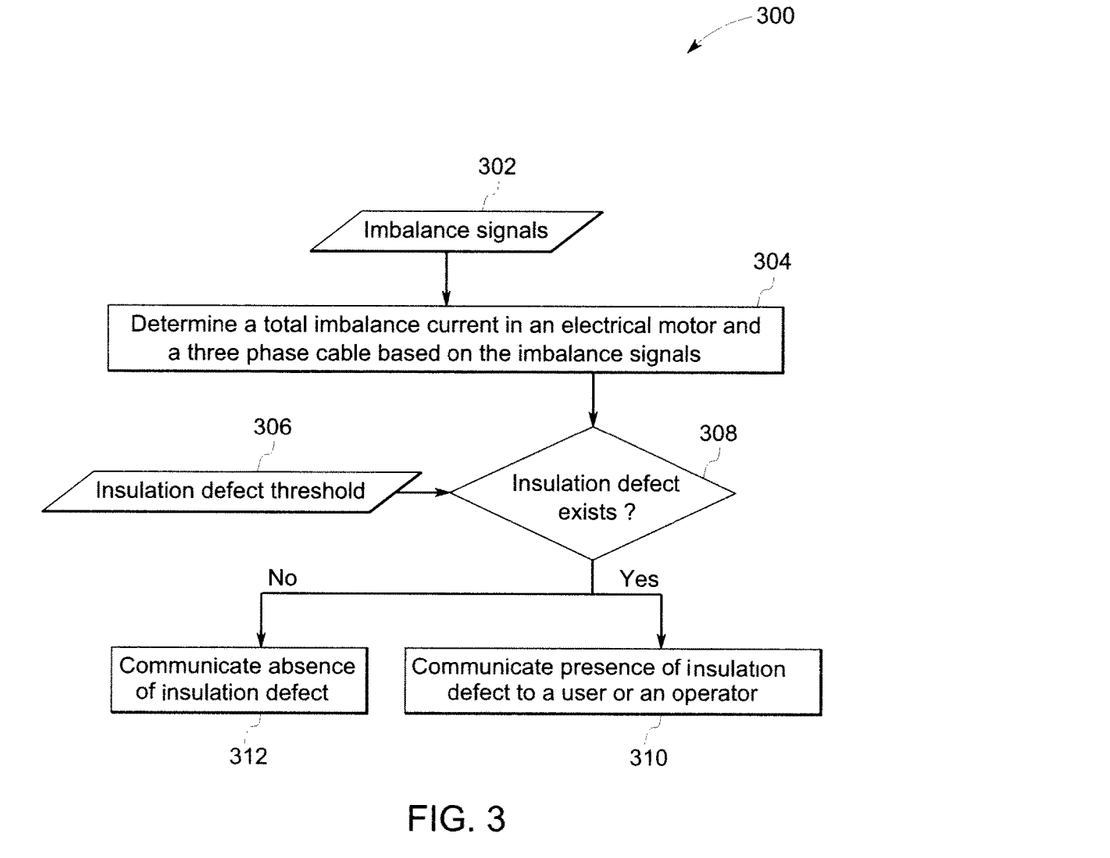
FIG. 3 is a flow chart illustrating a method for monitoring the health of at least one of a fluid lifting device and a three phase cable using a HSCT, in accordance with aspects of the present specification.

FIG. 3 is a flow chart illustrating a method 300 for monitoring health of at least one of an artificial fluid lifting device and a three phase cable using a high sensitivity differential current transformer, in accordance with aspects of the present specification. The method 300 of FIG. 3 will be described with reference to the components/elements in FIGS. 1-2. The fluid lifting device may be the fluid lifting device 102 (see FIG. 1) or the fluid lifting device 202 (see FIG. 2). Similarly, the three phase cable, for example may be the three phase cable 114 (see FIG. 1) or the three phase cable 214 (see FIG. 2). As previously noted, the fluid lifting device is used to draw/pump fluid out of a well. The three phase cable is used to operatively couple the fluid lifting device to a power source.

Reference numeral 302 is representative of imbalance signals. The imbalance signals 302 may serve as an input to the method 300 of FIG. 2. The imbalance signals 302 are representative of a total imbalance current in an electrical motor of a fluid lifting device and a three phase cable. The imbalance signals 302, for example, may be representative of the imbalance signals 128 of FIG. 1. In another example, the imbalance signals 302 may be representative of the second imbalance signals 228 of FIG. 2. In one embodiment, the imbalance signals 302 may be generated by the HSCT 104 of FIG. 1. In another embodiment, the imbalance signals 302 may be generated by the second HSCT 204 of FIG. 2.

At step 304, the total imbalance current in the electrical motor and the three phase cable may be determined based on the imbalance signals 302. The total imbalance current, for example may be determined from an amplitude of the imbalance signals 302. Furthermore at step 308, a check may be carried out to determine whether an insulation defect exists in at least one of the electrical motor and the three phase cable. In one example, the presence of an insulation defect may be determined based on the total imbalance current and an insulation defect threshold 306. The insulation defect threshold 306 may be specified by a user. As used herein, the term "insulation defect threshold" is representative of a numerical value that may be used to determine the existence of an insulation defect in at least one of an electrical motor or a three phase cable. Particularly, the presence of the insulation defect may be determined by comparing the total imbalance current with the insulation defect threshold 306. For example, if the value of the total imbalance current exceeds the insulation defect threshold 306, it may be determined that the insulation defect exists in at least one of the electrical motor and the three phase cable. Similarly, when the value of the total imbalance current is less than the insulation defect threshold 306, it may be determined that the electrical motor and the three phase cable are free of any insulation defects. At step 308, if it is determined that the insulation defect exists in at least one of the electrical motor and the three phase cable, control is transferred to step 310.

At step 310, presence of an insulation defect in the electrical motor and the three phase cable may be communicated to a user or an operator. The operator or user may then arrange to rectify the identified insulation defect. However, at block 308, if it is determined that there is no insulation defect in the electrical motor and the three phase cable, the control is transferred to block 312. At step 312, the absence of insulation defect may be communicated to the user. No further action may be necessary.

Figure 4:
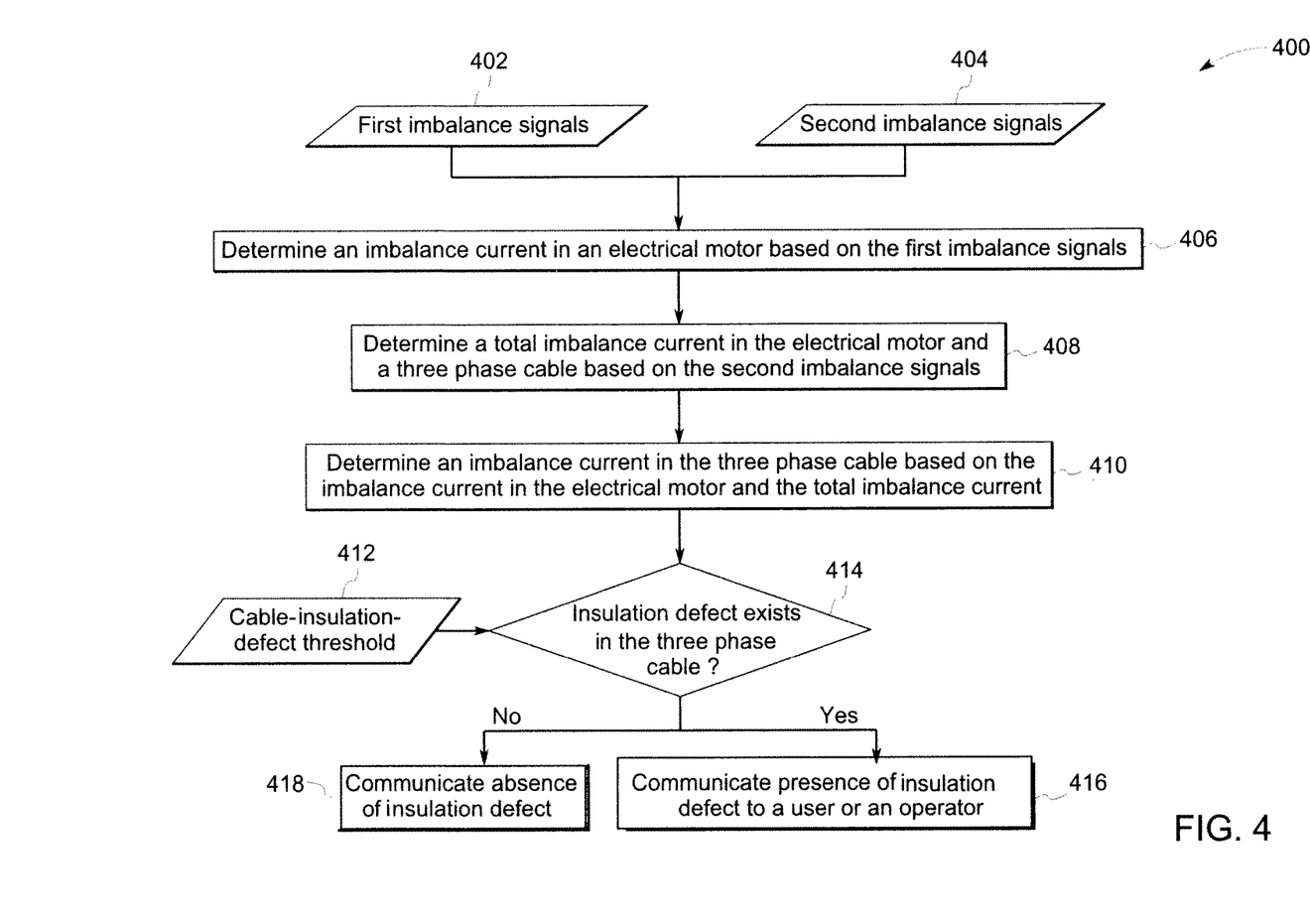
FIG. 4 is a flow chart illustrating a method for monitoring the health of a three phase cable, in accordance with aspects of the present specification.

FIG. 4 is a flow chart illustrating a method 400 for monitoring health of a three phase cable, in accordance with aspects of the present specification. The method of FIG. 4 will be described with reference to the components of FIG. 1-2. The three phase cable, for example may be the three phase cable 114 (see FIG. 1) or the three phase cable 214 (see FIG. 2). Reference numeral 402 is representative of first imbalance signals. As previously noted, the first imbalance signals 402 are representative of an imbalance current in an electrical motor of a fluid lifting device. The electrical motor, for example may be the electrical motor 108 (see FIG. 1) or the electrical motor 208 (see FIG. 2). The fluid lifting device, for example, may be the fluid lifting device 102 (see FIG. 1) or the fluid lifting device 202 (see FIG. 2). The first imbalance signals 402, for example may be generated by the first HSCT 203 located inside the well 206. Moreover, the first imbalance signals 402, for example, may be representative of the first imbalance signals 227 of FIG. 1.

Reference numeral 404 is representative of second imbalance signals. As previously noted, the second imbalance signals 404 are representative of a total imbalance current ($I_4$ and $I_5$) in the three phase cable and the electrical motor. The second imbalance signals 404, for example may be generated by the second HSCT 204 located outside the well 206. Also, the second imbalance signals 404, for example, may be the second imbalance signals 228 representative of the total imbalance current ($I_4$ and $I_5$) in the three phase cable 214 and the electrical motor 208 of FIG. 2.

The first imbalance signals 402 and the second imbalance signals 404 serve as inputs to the method 400 of FIG. 4. At step 406, the imbalance current in the electrical motor may be determined based on the first imbalance signals 402. The imbalance current in the electrical motor, for example may be determined from an amplitude of the first imbalance signals 402. Furthermore, at step 408, a total imbalance current in the electrical motor and the three phase cable may be determined based on the second imbalance signals 404. The total imbalance current in the electrical motor and the three phase cable, for example may be determined from an amplitude of the second imbalance signals 404. Moreover, at step 410, an imbalance current in the three phase cable may be determined based on the imbalance current in the electrical motor and the total imbalance current in the electrical motor and the three phase cable. The imbalance current in the three phase cable, for example may be determined using equation (3).

At step 414, a check may be carried out to determine whether an insulation defect exists in the three phase cable. The check, for example may be carried out based on the imbalance current in the three phase cable and a cable-insulation-defect threshold 412. The cable-insulation-defect threshold 412, for example may be specified by a user. As used herein, the term "cable-insulation-defect threshold" is representative of a threshold value that may be used to determine the existence of an insulation defect in the three phase cable. Particularly, the presence of the insulation defect may be determined by comparing the imbalance current in the three phase cable with the cable-insulation-defect threshold 412. Accordingly, at step 414 if the imbalance current in the three phase cable exceeds the cable-insulation-defect threshold 412, it may be determined that the insulation defect exists in the three phase cable. Similarly, when the value of the imbalance current in the three phase cable is less than the cable-insulation-defect threshold 412, it may be determined that the three phase cable is free of any insulation defects. At step 414, if it is determined that the insulation defect exists in the three phase cable, control is transferred to step 416.

Furthermore, at step 416, presence of the insulation defect in the three phase cable may be communicated to a user or an operator. The operator or user may then arrange to rectify the identified defects. However, at step 414, if it is determined that that there are no insulation defects in the three phase cable, then the control is transferred to step 418. At step 418, the absence of insulation defects may be communicated to the user. No further action may be necessary.

Figure 5:
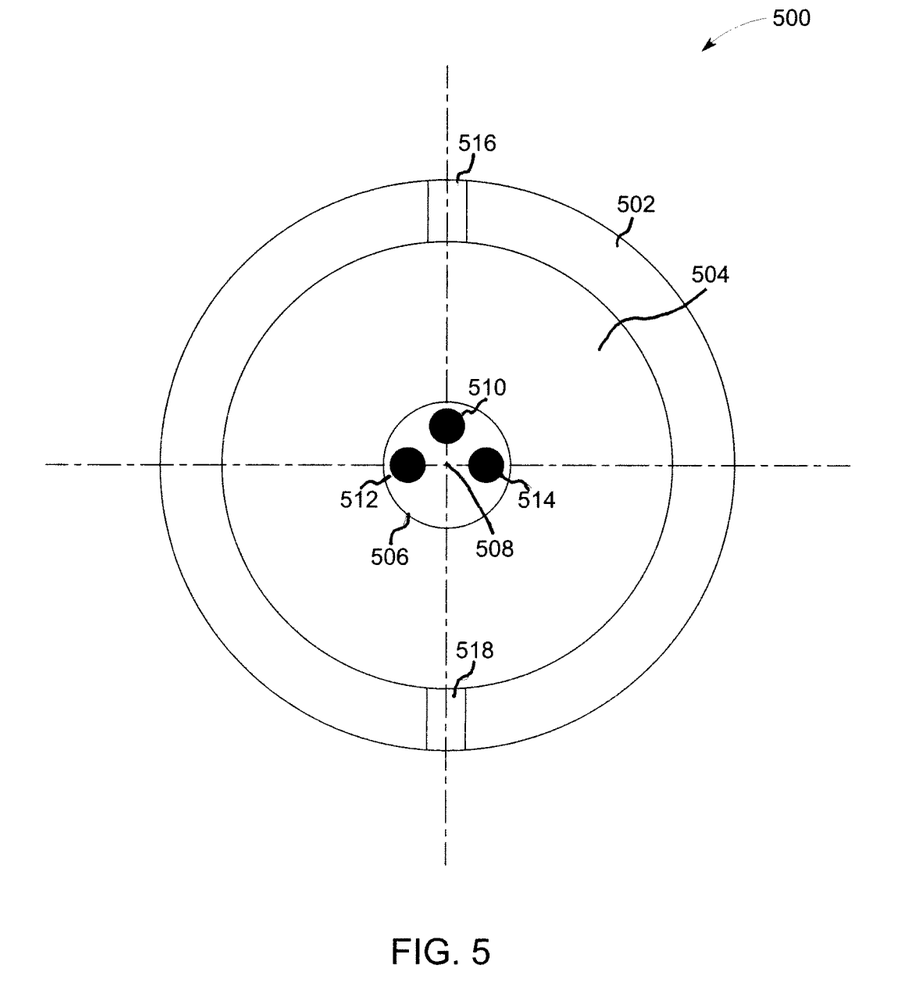
FIG. 5 is a diagrammatic illustration of an exemplary high sensitivity differential current transformer (HSCT), in accordance with aspects of the present specification.

Referring to FIG. 5, a diagrammatic illustration of an exemplary high sensitivity differential current transformer (HSCT) 500, in accordance with aspects of the present specification, is presented. The HSCT 500 includes a magnetic core 502 defining a central opening 504. In accordance with aspects of the present specification, the magnetic core 502 may include a material such as, but not limited to, silicon steel, alloys, ferrites, and the like. Furthermore, in one embodiment, the magnetic core 502 may be circular in shape. In other embodiments, the magnetic core 502 may be a triangle, a square, a rectangle, or a polygon. In accordance with further aspects of the present specification, the magnetic core 502 may include a uniform solid core. Alternatively, the magnetic core 502 may be a split core.

A three phase cable 506 passes through a center 508 of the HSCT 500 and the central opening 504 of the HSCT 500. The three phase cable 506, for example, may be the three phase cable 114 (see FIG. 1) or the three phase cable 214 (see FIG. 2). The three phase cable 506 includes a first phase conductor 510, a second phase conductor 512, and a third phase conductor 514.

In the embodiment illustrated in FIG. 5, the magnetic core 502 is shown as including a first coil 516 and a second coil 518 disposed on the magnetic core 502. In accordance with aspects of the present specification, the coils 516, 518 include a plurality of windings (not shown in FIG. 5) wound around the magnetic core 502. The coils 516, 518 may constitute secondary windings of the HSCT 500. It may be noted that while the presently contemplated configuration shows only two coils 516, 518, the HSCT 500 may have more than two coils. Also, in the presently contemplated configuration, the first coil 516 may be operationally coupled to the second coil 518. The coils 516, 518 may be electrically coupled to a reading device that generates imbalance signals (not shown) representative of an imbalance current in a device and/or a three phase cable based on a location of the HSCT 500. The device, for example, may be the electrical motor 108 (see FIG. 1) or the electrical motor 208 (see FIG. 2).

The present systems and methods monitor the health of a fluid lifting device and/or a three phase cable without interfering with or interrupting the operation of the fluid lifting device. In particular, the present systems and methods monitor the health of the fluid lifting device and the three phase cable while circumventing the need for taking the fluid lifting device and the three phase cable outside the well, thereby circumventing any down time.

While only certain features of the embodiments have been illustrated and described herein, many modifications and changes will occur to those skilled in the art. It is, therefore, to be understood that the appended claims are intended to cover all such modifications and changes as fall within the true spirit of the disclosure.

The invention claimed is:

1. A system, comprising:
   a fluid lifting device located inside a well and comprising an electrical motor;
   a three phase cable for coupling the fluid lifting device to a power source;
   at least one high sensitivity differential current transformer for generating imbalance signals representative of an imbalance current in at least one of the electrical motor and the three phase cable, wherein the at least one high sensitivity differential current transformer is disposed such that the at least one high sensitivity differential current transformer surrounds at least a portion of the three phase cable; and
   a processing subsystem for monitoring health of at least one of the fluid lifting device and the three phase cable based on the imbalance signals,
   wherein the imbalance signals comprise first imbalance signals representative of the imbalance current in the electrical motor, and second imbalance signals representative of a total imbalance current in the electrical motor and the three phase cable.

2. The system of claim 1, wherein a first section of the three phase cable is covered by one or more cable sheaths and a grounding cable sheath, and a second section of the three phase cable is covered by the one or more cable sheaths, and wherein the second section is not covered by the grounding cable sheath.

3. The system of claim 2, wherein the at least one high sensitivity differential current transformer is disposed such that the at least one high sensitivity differential current transformer surrounds the second section of the three phase cable.

4. The system of claim 3, wherein a length of the second section of the three phase cable is equal to a width of the at least one high sensitivity differential current transformer.

5. The system of claim 1, wherein the processing subsystem is configured to monitor the health of the at least one of the fluid lifting device and the three phase cable by identifying insulation defects in at least one of the electrical motor and the three phase cable based on the imbalance signals.

6. The system of claim 1, wherein the three phase cable comprises a first phase conductor, a second phase conductor, and a third phase conductor.

7. The system of claim 6, further comprising at least one sensing device for generating electrical signals representative of a current and a voltage corresponding to at least one of the first phase conductor, the second phase conductor and the third phase conductor, wherein the at least one sensing device is operationally coupled to at least one of the first phase conductor, the second phase conductor and the third phase conductor.

8. The system of claim 7, wherein the processing subsystem is further configured to: receive the electrical signals from the at least one sensing device; and determine one or more defects in one or more components of the electrical motor and a pump in the fluid lifting device based on the electrical signals.

9. The system of claim 8, wherein the one or more components comprise at least one of a rotor, a stator, bearings and sleeve bearings in the electrical motor, and the one or more defects comprise high frequency electric discharge through the bearings, damaged bars of the rotor, insulation defects in the stator, and eccentricity faults in the electrical motor.

10. The system of claim 1, wherein the fluid lifting device comprises an electrical submersible pump, a subsea boosting system, or a combination thereof.

11. The system of claim 1, wherein at least a portion of the three phase cable and the at least one high sensitivity differential current transformer are located outside the well.

12. The system of claim 1, wherein the at least one high sensitivity differential current transformer comprises:
   a first high sensitivity differential current transformer, wherein the first high sensitivity differential current transformer is disposed such that the first high sensitivity differential current transformer surrounds a first portion of the three phase cable, and wherein the first high sensitivity differential current transformer is disposed inside the well; and
   a second high sensitivity differential current transformer, wherein the second high sensitivity differential current transformer is disposed such that the second high sensitivity differential current transformer surrounds a second portion of the three phase cable, and wherein the second high sensitivity differential current transformer is disposed outside the well.

13. The system of claim 12, wherein the first high sensitivity differential current transformer is located at a junction where the three phase cable is coupled to the fluid lifting device.

14. The system of claim 12, wherein the first high sensitivity differential current transformer is configured to generate the first imbalance signals representative of the imbalance current in the electrical motor.

15. The system of claim 12, wherein the second high sensitivity differential current transformer is configured to generate the second imbalance signals representative of the total imbalance current in the electrical motor and the three phase cable.

16. The system of claim 15, wherein the processing subsystem is configured to determine an imbalance current in the three phase cable based on the imbalance current in the electrical motor and the total imbalance current in the electrical motor and the three phase cable.

17. The system of claim 16, wherein the processing subsystem is further configured to monitor the health of the three phase cable based on the imbalance current in the three phase cable.

18. A system, comprising:
   a fluid lifting device located inside a well, the fluid lifting device comprising an electrical motor;
   a three phase cable for coupling the fluid lifting device to a power source;
   a first high sensitivity differential current transformer for generating first imbalance signals representative of an imbalance current in the electrical motor, wherein the first high sensitivity differential current transformer is disposed such that the first high sensitivity differential current transformer surrounds a first portion of the three phase cable, and wherein the first high sensitivity differential current transformer is disposed inside the well; and
   a second high sensitivity differential current transformer for generating second imbalance signals representative of a total imbalance current in the electrical motor and the three phase cable, wherein the second high sensitivity differential current transformer is disposed such that the second high sensitivity differential current transformer surrounds a second portion of the three phase cable, and wherein the second high sensitivity differential current transformer is disposed outside the well; and a processing subsystem for monitoring health of the three phase cable based on the imbalance current in the electrical motor and the total imbalance current in the electrical motor and the three phase cable.

19. A method for monitoring health of a three phase cable that couples a fluid lifting device to a power source, the method comprising:

determining, by a processor, an imbalance current in an electrical motor disposed in the fluid lifting device based on first imbalance signals, wherein the first imbalance signals are provided by a first high-sensitivity differential current transformer;

determining, by the processor, a total imbalance current in the electrical motor and the three phase cable based on second imbalance signals, wherein the second imbalance signals are provided by the first high-sensitivity differential current transformer;

determining, by the processor, an imbalance current in the three phase cable based on the imbalance current in the electrical motor and the total imbalance current in the electrical motor and the three phase cable; and     determining, by the processor, whether an insulation defect is present in the three phase cable based on the imbalance current in the three phase cable and a cable-insulation-defect threshold.

\* \* \* \* \*